(12) United States Patent
Lee et al.

(10) Patent No.: US 12,193,152 B2
(45) Date of Patent: Jan. 7, 2025

(54) CIRCUIT BOARD

(71) Applicant: LG INNOTEK CO., LTD., Seoul (KR)

(72) Inventors: Dong Keon Lee, Seoul (KR); Jung Hoon Park, Seoul (KR); Seok Jong Youh, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 227 days.

(21) Appl. No.: 17/926,681

(22) PCT Filed: May 21, 2021

(86) PCT No.: PCT/KR2021/006308
§ 371 (c)(1),
(2) Date: Nov. 21, 2022

(87) PCT Pub. No.: WO2021/235877
PCT Pub. Date: Nov. 25, 2021

(65) Prior Publication Data
US 2023/0199944 A1    Jun. 22, 2023

(30) Foreign Application Priority Data

May 21, 2020 (KR) .................... 10-2020-0060679

(51) Int. Cl.
*H05K 1/09* (2006.01)
*H05K 1/02* (2006.01)

(52) U.S. Cl.
CPC ............. *H05K 1/0256* (2013.01); *H05K 1/09* (2013.01)

(58) Field of Classification Search
CPC ............................... H05K 1/09; H05K 1/0284
See application file for complete search history.

(56) References Cited

U.S. PATENT DOCUMENTS 9,741,652 B1 * 8/2017 Sakaguchi ........... H05K 1/0296
10,756,008 B2   8/2020 Mitsukura et al.
2015/0103494 A1 4/2015 Kim et al.

FOREIGN PATENT DOCUMENTS

EP        0441164       8/1991
JP     2001-024295      1/2001
(Continued)

OTHER PUBLICATIONS

International Search Report dated Sep. 13, 2021 issued in Application No. PCT/KR2021/006308.

*Primary Examiner* — Jeremy C Norris
(74) *Attorney, Agent, or Firm* — KED & ASSOCIATES, LLP

(57) ABSTRACT

A circuit board according to an embodiment includes an insulating layer; a first circuit pattern disposed on a first surface of the insulating layer; a first solder resist disposed on the first surface of the insulating layer; and a first barrier layer including a first-first portion disposed between the first solder resist and the first circuit pattern, and a first-second portion disposed between the insulating layer and the first circuit pattern; wherein the firs-first portion of the first barrier layer includes: a first-first gold (Au) layer disposed under a lower surface of the first circuit pattern; and a first-first palladium (Pd) layer disposed under a lower surface of the first-first gold (Au) layer; wherein the first-second portion of the first barrier layer includes: a first-second gold (Au) layer disposed to surround a side surface and an upper surface of the first circuit pattern; and a first-second palladium (Pd) layer disposed to surround the first-second gold (Au) layer; and wherein the first circuit pattern is not in contact with the first solder resist and the insulating layer by the first-first portion and the first-second portion of the first barrier layer.

18 Claims, 7 Drawing Sheets

(56) References Cited

FOREIGN PATENT DOCUMENTS

| JP | 2016-085998 | 5/2016 |
|---|---|---|
| KR | 10-2012-0012348 | 2/2012 |
| KR | 10-2012-0072633 | 7/2012 |
| KR | 10-2014-0016470 | 2/2014 |
| KR | 10-2015-0043135 | 4/2015 |
| KR | 10-2018-0113591 | 10/2018 |

* cited by examiner

[FIG. 1]
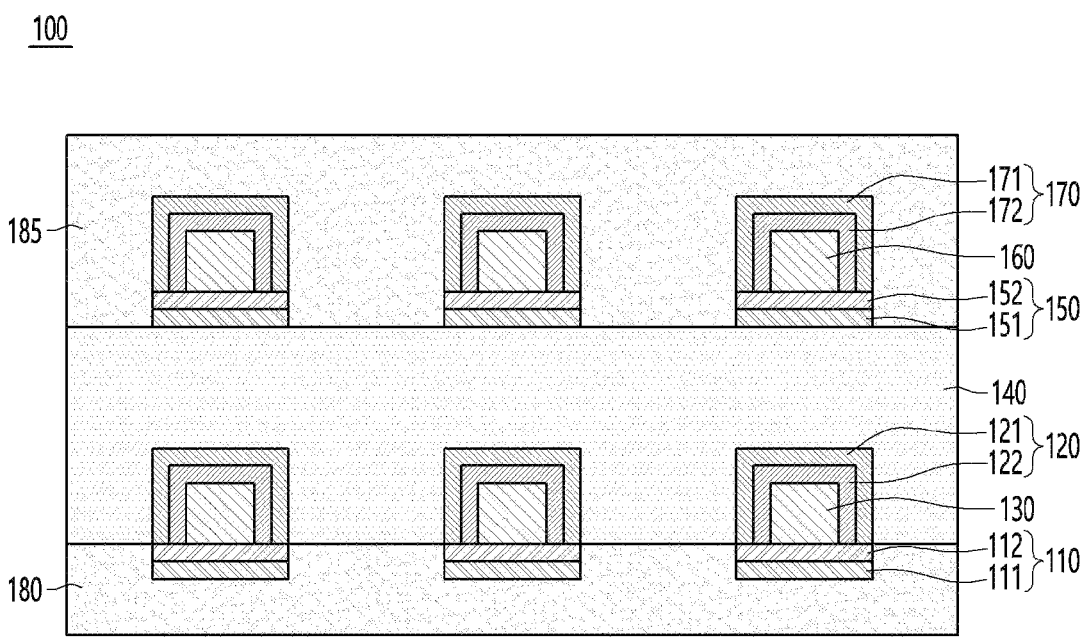
[FIG. 2]
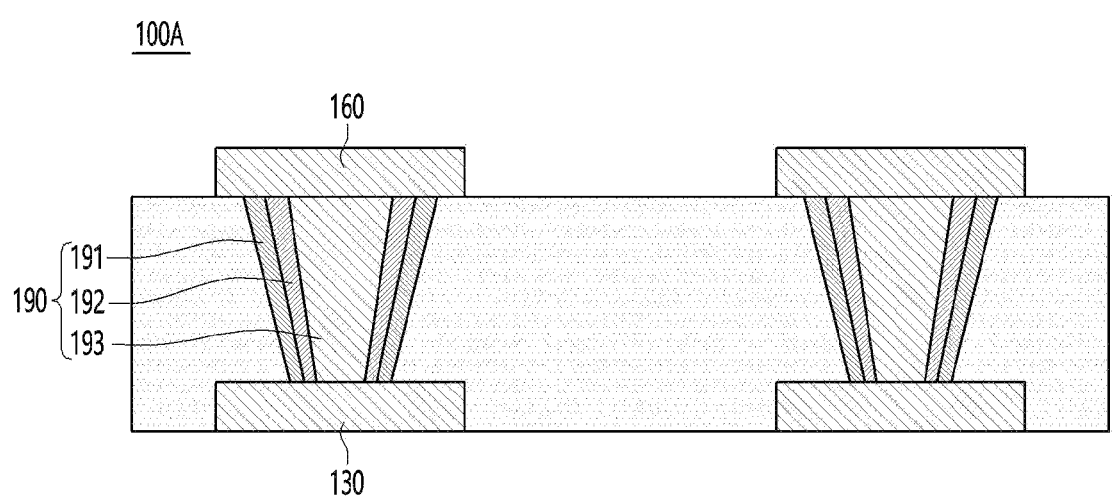

[FIG. 3]
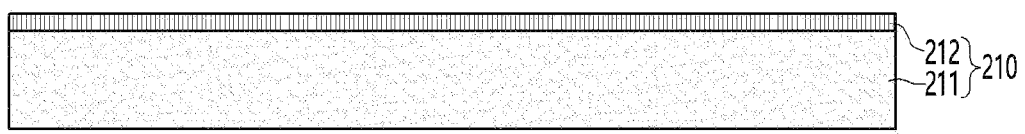
[FIG. 4]
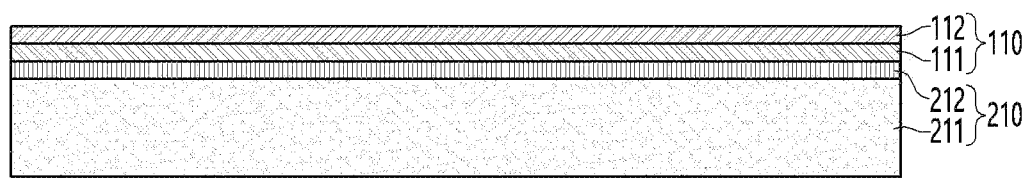
[FIG. 5]
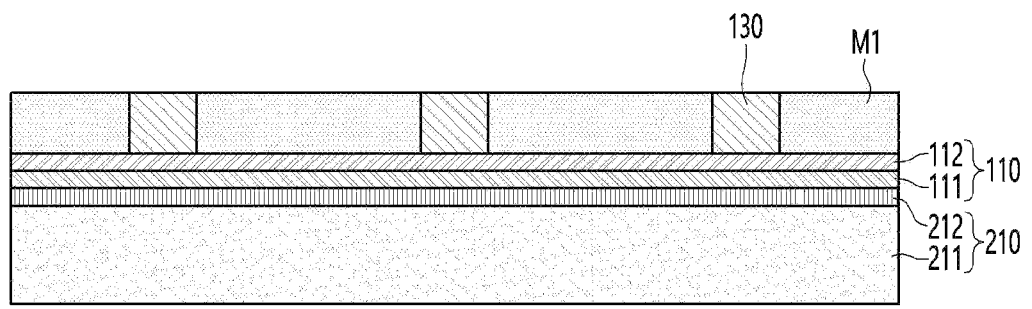

[FIG. 6]
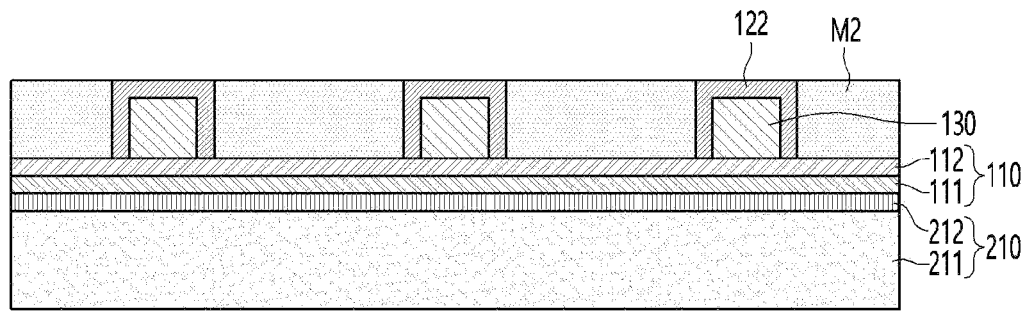
[FIG. 7]
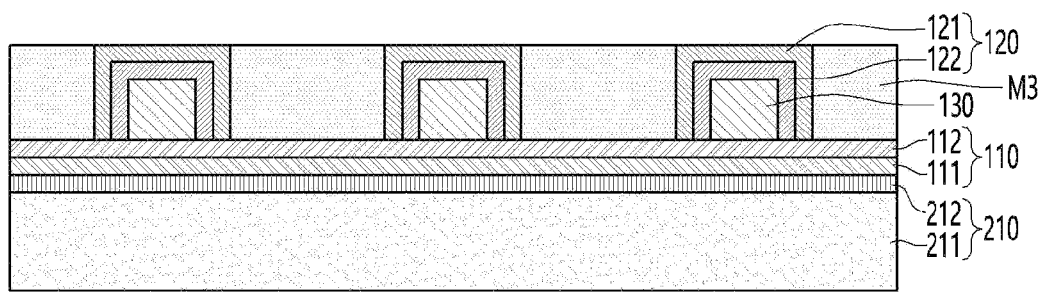
[FIG. 8]
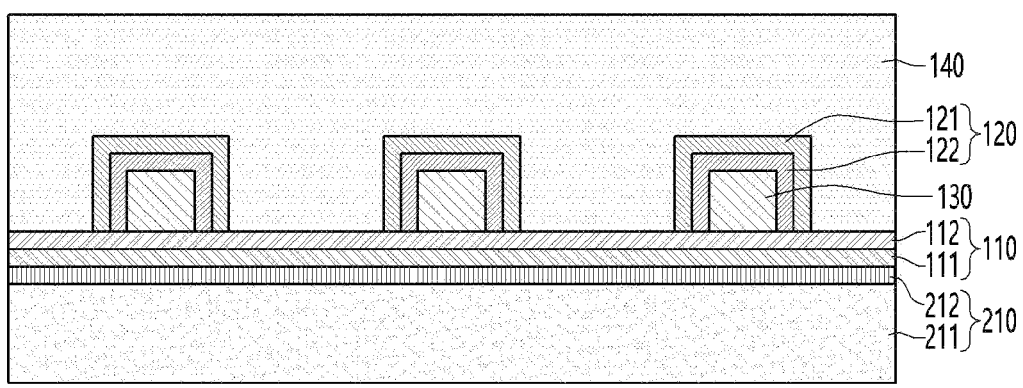

【FIG. 9】
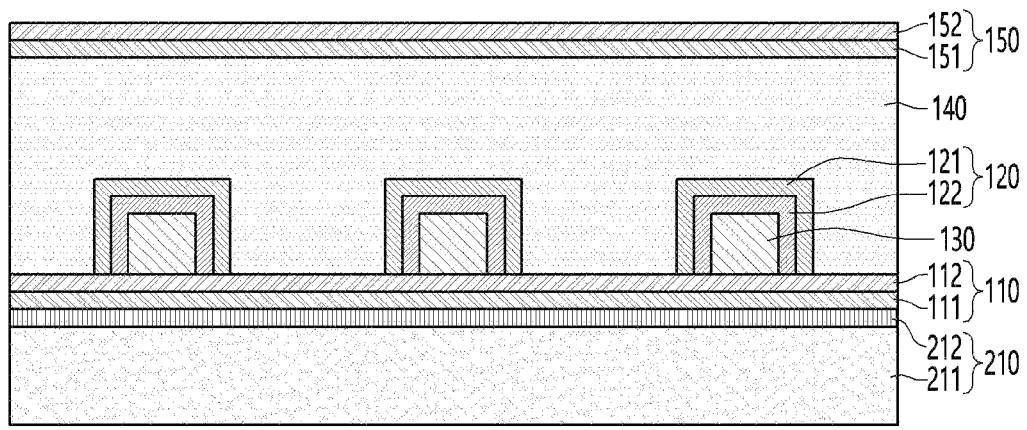
【FIG. 10】
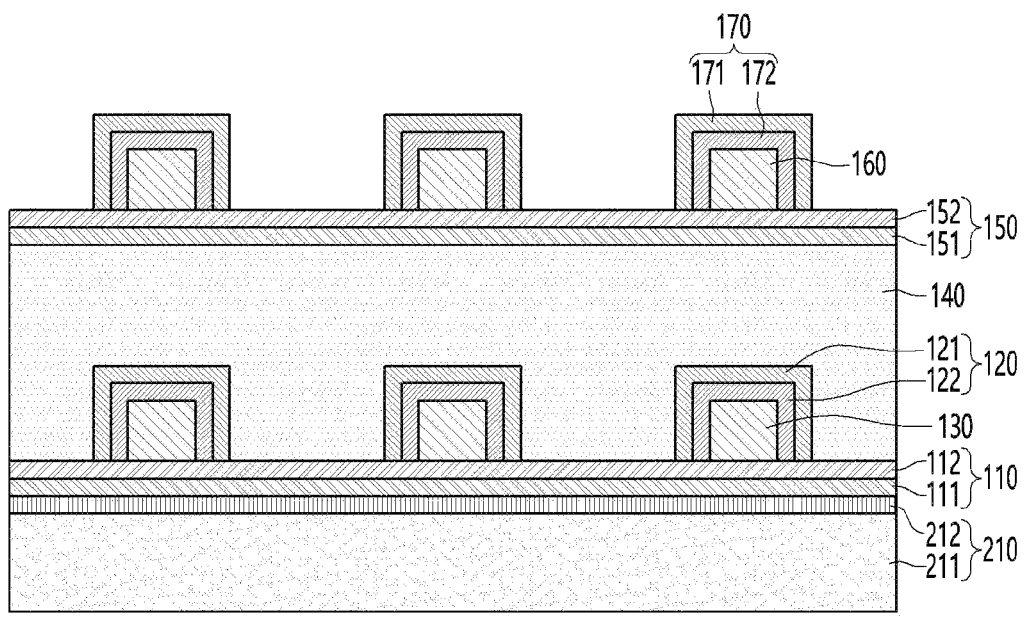

[FIG. 11]
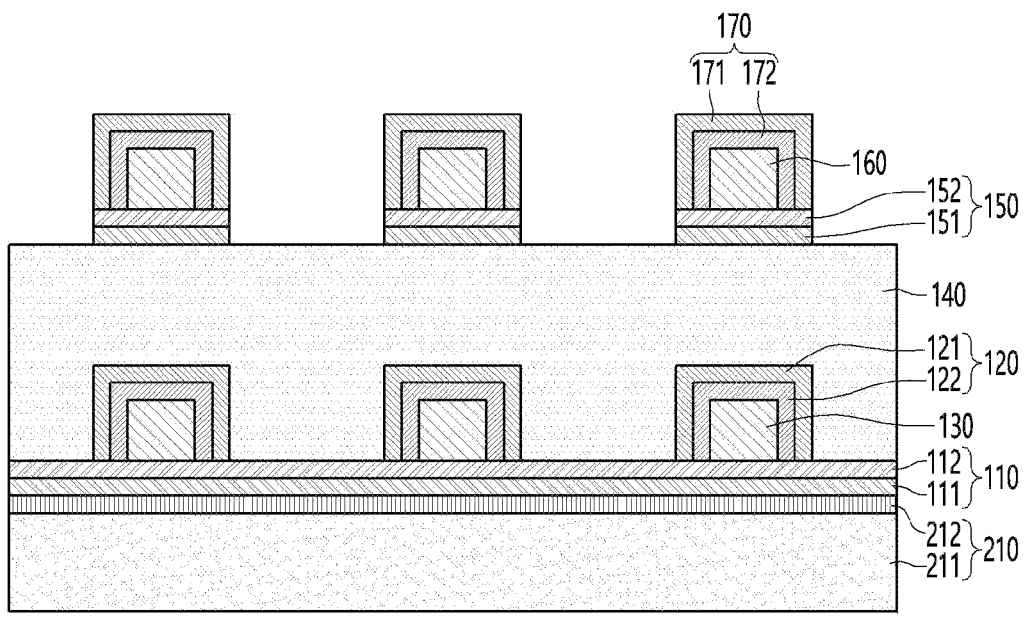
[FIG. 12]
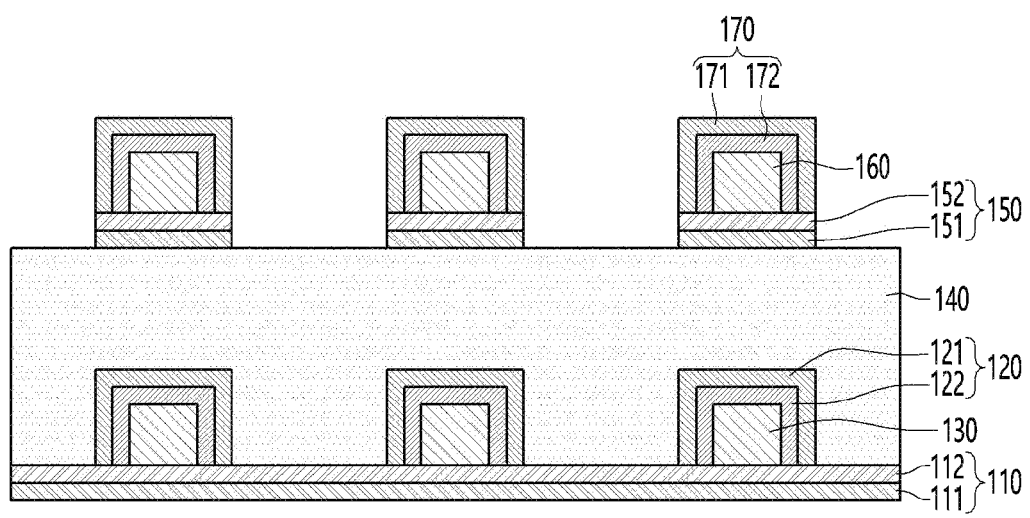

【FIG. 13】
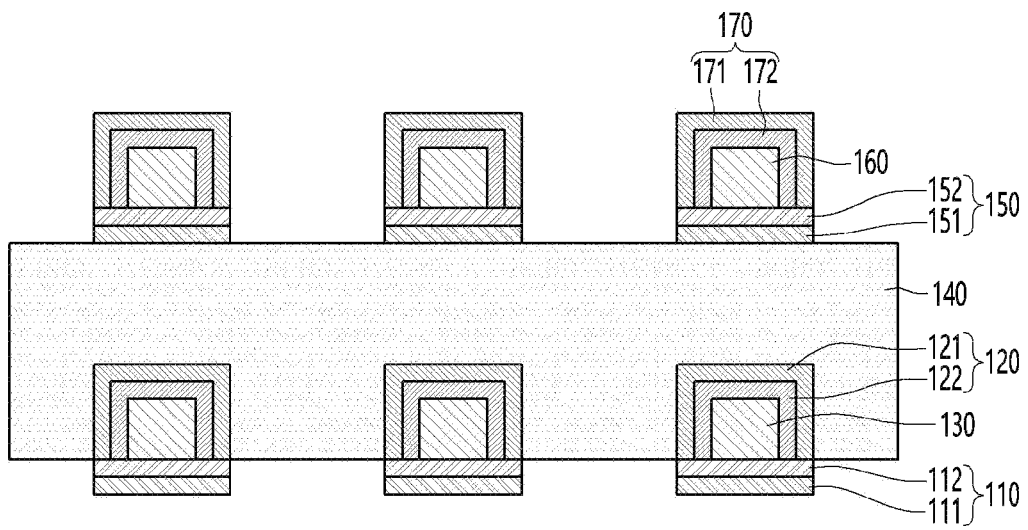
【FIG. 14】
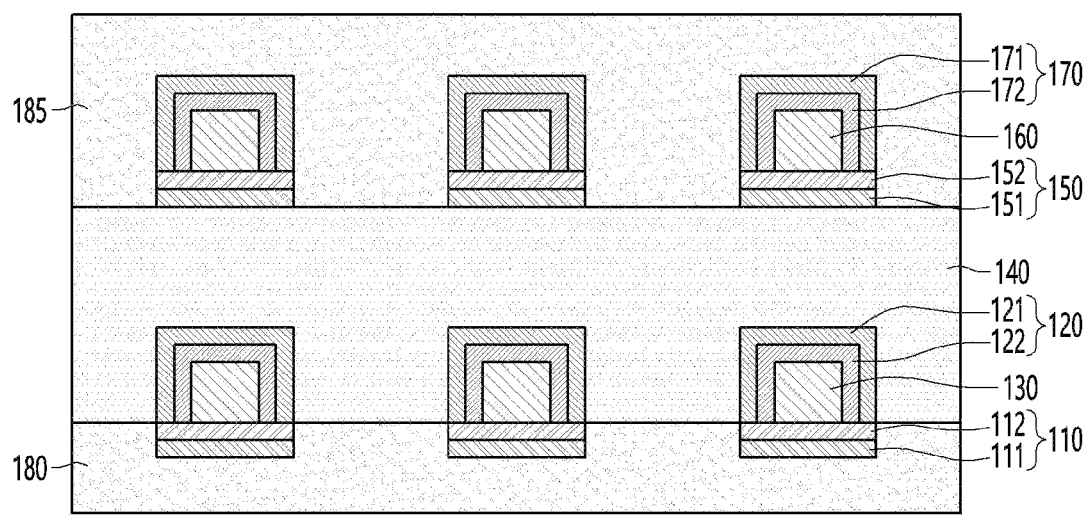

[FIG. 15]
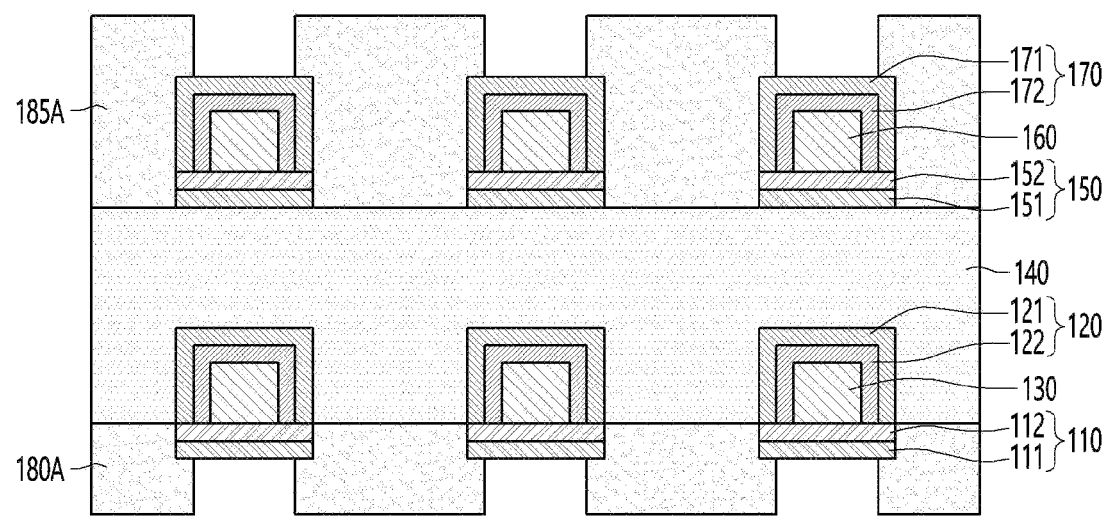

CIRCUIT BOARD

CROSS-REFERENCE TO RELATED PATENT APPLICATIONS

This application is a U.S. National Stage Application under 35 U.S.C. § 371 of PCT Application No. PCT/KR2021/006308, filed May 21, 2021, which claims priority to Korean Patent Application No. 10-2020-0060679, filed May 21, 2020, whose entire disclosures are hereby incorporated by reference.

TECHNICAL FIELD

An embodiment relates to a circuit board.

BACKGROUND ART

A line width of a circuit has been miniaturized as miniaturization, weight reduction, and integration of an electronic component are accelerated. In particular, as a design rule of a semiconductor chip is integrated on a nanometer scale, a circuit line width of a package substrate or a printed circuit board on which the semiconductor chip is mounted has been miniaturized to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for miniaturizing the circuit pitch.

Meanwhile, recently, efforts have been made to develop an improved 5G (5th generation) communication system or a pre-5G communication system in order to meet a demand for wireless data traffic. Here, the 5G communication system uses ultra-high frequency (mmWave) bands (sub 6 GHz, 28 GHz, 38 GHz, or higher frequencies) to achieve high data transfer rates.

In addition, integration technologies such as beamforming, massive multi-input multi-output (massive MIMO), and array antennas have been developed in the 5G communication system in order to reduce a path loss of radio waves and increase a transmission distance of radio waves in the ultra-high frequency band. Antenna systems are relatively large given that they can consist of hundreds of active antennas of wavelengths in these frequency bands.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

And, the circuit board applied to the 5G communication system as described above is manufactured according to a trend of light, thin and compact, and accordingly, the circuit pattern is gradually becoming finer.

However, an interval between the patterns in a circuit board including a conventional fine circuit pattern becomes narrower as the pitch between the patterns becomes smaller, and thus, reliability problems occur. Specifically, migration of a metal material constituting a circuit pattern in a conventional circuit board occurs during reliability evaluation, thereby causing a reliability problem.

DISCLOSURE

Technical Problem

The embodiment provides a circuit board having a novel structure and a method of manufacturing the same.

In addition, the embodiment provides a circuit board capable of suppressing migration of a metal material constituting a circuit pattern to an insulating layer and a method of manufacturing the same.

In addition, the embodiment provides a circuit board capable of suppressing migration of a metal material constituting a circuit pattern to a solder resist and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes an insulating layer; a first circuit pattern disposed on a first surface of the insulating layer; a first solder resist disposed on the first surface of the insulating layer; and a first barrier layer including a first-first portion disposed between the first solder resist and the first circuit pattern, and a first-second portion disposed between the insulating layer and the first circuit pattern; wherein the firs-first portion of the first barrier layer includes: a first-first gold (Au) layer disposed under a lower surface of the first circuit pattern; and a first-first palladium (Pd) layer disposed under a lower surface of the first-first gold (Au) layer; wherein the first-second portion of the first barrier layer includes: a first-second gold (Au) layer disposed to surround a side surface and an upper surface of the first circuit pattern; and a first-second palladium (Pd) layer disposed to surround the first-second gold (Au) layer; and wherein the first circuit pattern is not in contact with the first solder resist and the insulating layer by the first-first portion and the first-second portion of the first barrier layer.

In addition, the first-first gold (Au) layer has a first width, and a lower surface of the first circuit pattern has a second width smaller than the first width.

In addition, the lower surface of the first-first gold (Au) layer includes: a first region in contact with a lower surface of the first circuit pattern; a second region in contact with the first-second palladium (Pd) layer; and a third region in contact with the first-second gold (Au) layer.

In addition, the first circuit pattern is buried in a lower region of the insulating layer.

In addition, the lower surface of the first circuit pattern is positioned on the same plane as a lower surface of the insulating layer, and the first-first portion of the first barrier layer is disposed to protrude downward from the lower surface of the insulating layer.

In addition, the circuit board further includes a second circuit pattern disposed on a second surface of the insulating layer; a second solder resist disposed on the second surface of the insulating layer; and a second barrier layer including a second-first portion disposed between the insulating layer and the second circuit pattern and a second-second portion disposed between the second solder resist and the second circuit pattern.

In addition, the second-first portion of the second barrier layer includes: a second-first gold (Au) layer disposed under a lower surface of the second circuit pattern; and a second-first palladium (Pd) layer disposed between a lower surface of the second-first gold (Au) layer and an upper surface of the insulating layer; wherein the second-second portion of the second barrier layer includes: a second-second gold (Au) layer disposed to surround a side surface and an upper surface of the second circuit pattern; and a second-second palladium (Pd) layer disposed to surround the second-second gold (Au) layer; and wherein the second circuit pattern is not in contact with the insulating layer and the second solder resist by the second-first portion and the second-second portion of the second barrier layer.

In addition, the second-first gold (Au) layer has a first width, and wherein a lower surface of the second circuit pattern has a second width smaller than the first width.

In addition, a lower surface of the second-first gold (Au) layer includes: a first region in contact with a lower surface of the second circuit pattern; a second region in contact with the second-second palladium (Pd) layer; and a third region in contact with the second-second gold (Au) layer.

In addition, the second circuit pattern is disposed to protrude on the upper surface of the insulating layer.

On the other hand, a manufacturing method of a circuit board according to the embodiment includes: preparing a carrier board; forming a first-first portion of a first barrier layer on the carrier board; forming a first circuit pattern on the first-first portion of the first barrier layer; forming a first-second portion of the first barrier layer on the first circuit pattern; forming an insulating layer covering the first circuit pattern on the first-first portion of the first barrier layer; forming a second-first portion of a second barrier layer on the insulating layer; forming a second circuit pattern on the second-first portion of the second barrier layer; forming a second-second portion of the second barrier layer on the second circuit pattern; removing the carrier board; forming a first solder resist under a lower surface of the insulating layer; and forming a second solder resist on an upper surface of the insulating layer, wherein the firs-first portion of the first barrier layer includes: a first-first gold (Au) layer disposed under a lower surface of the first circuit pattern; and a first-first palladium (Pd) layer disposed under a lower surface of the first-first gold (Au) layer; wherein the first-second portion of the first barrier layer includes: a first-second gold (Au) layer disposed to surround a side surface and an upper surface of the first circuit pattern; and a first-second palladium (Pd) layer disposed to surround the first-second gold (Au) layer, wherein the second-first portion of the second barrier layer includes: a second-first gold (Au) layer disposed under a lower surface of the second circuit pattern; and a second-first palladium (Pd) layer disposed between a lower surface of the second-first gold (Au) layer and an upper surface of the insulating layer; and wherein the second-second portion of the second barrier layer includes: a second-second gold (Au) layer disposed to surround a side surface and an upper surface of the second circuit pattern; and a second-second palladium (Pd) layer disposed to surround the second-second gold (Au) layer.

In addition, the first circuit pattern is not in contact with the first solder resist and the insulating layer by the first-first portion and the first-second portion of the first barrier layer, and the second circuit pattern is not in contact with the insulating layer and the second solder resist by the second-first portion and the second-second portion of the second barrier layer.

In addition, the first-first gold (Au) layer or the second-first gold (Au) layer has a first width, and a lower surface of the first circuit pattern or a lower surface of the second circuit pattern has a second width smaller than the first width.

In addition, a lower surface of the first-first gold (Au) layer includes a first region in contact with a lower surface of the first circuit pattern, a second region in contact with the first-second palladium (Pd) layer, and a third region in contact with the first-second gold (Au) layer.

In addition, a lower surface of the first circuit pattern is positioned on the same plane as a lower surface of the insulating layer, and the first-first portion of the first barrier layer is disposed to protrude downward from the lower surface of the insulating layer.

Advantageous Effects

The embodiment provides a circuit board including an insulating layer and a circuit pattern. In this case, the circuit pattern includes a metal material. In addition, the circuit pattern including the metal material does not directly contact the insulating layer. To this end, a barrier layer is disposed around the circuit pattern. Accordingly, the embodiment may prevent the metal material constituting the circuit pattern from penetrating into the insulating layer, thereby improving electrical and/or physical reliability of the circuit board.

For example, when the circuit pattern includes copper, the barrier layer includes a gold metal layer disposed around the circuit pattern and containing gold (Au), and a palladium metal layer disposed around the gold metal layer and including palladium (Pd). The palladium metal layer may prevent copper constituting the circuit pattern from penetrating toward the insulating layer, and accordingly, it is possible to improve reliability by suppressing the occurrence of copper migration. In addition, the gold metal layer is disposed between the palladium metal layer and the circuit pattern to form the palladium metal layer. In this case, the gold metal layer includes gold (Au) having a larger grain size than other layers, and thus the palladium metal layer can be stably formed. For example, when using ITO (Indium Tin Oxide) as the barrier layer, the ITO may be a conductive oxide other than a metal. In addition, when the circuit pattern uses silver (Ag), the barrier layer may prevent silver (Ag) constituting the circuit pattern from penetrating into the insulating layer.

In addition, the barrier layer in the embodiment is also formed on a circuit pattern disposed on an outermost layer among the circuit patterns. This may prevent migration of copper constituting the circuit pattern of the outermost layer to a solder resist.

In addition, a portion of the barrier layer is disposed on a surface of a buried pattern in the ETS (Embedded Trace Substrate) structure of the embodiment. In this case, the barrier layer is disposed to protrude on the surface of the buried pattern, and this may function as a mounting pad on which a solder layer for mounting a device is disposed. That is, a buried pattern of a conventional ETS structure is formed in a fine pattern, as a result, it was not possible to function as a mounting pad only with a simple pattern, and accordingly, a separate mounting pad having a structure that is buried in the insulating layer or protrudes above the surface of the insulating layer has to be formed. At this time, when the mounting pad is buried in the insulating layer, an interval between the fine patterns is widened by a width of the mounting pad, and thus there is a problem in circuit integration. In addition, when a structure in which the mounting pad protrudes on the insulating layer is applied, it was necessary to proceed with a separate process to form it. On the other hand, when forming the barrier layer on the buried pattern, the embodiment allows a portion of the barrier layer to have a structure protruding on a surface of the insulating layer, and accordingly, the barrier layer can be used as a mounting pad, thereby simplifying the manufacturing process.

DESCRIPTION OF DRAWINGS

FIG. 1 is a view showing a circuit board according to an embodiment.

FIG. 2 is a view showing a circuit board including a via according to an embodiment.

FIGS. 3 to 15 are views showing a method of manufacturing a circuit board shown in FIG. 1 in order of process.

BEST MODE

Hereinafter, embodiments of the present invention will be described in detail with reference to the accompanying drawings.

However, spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (a), and (b) may be used.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. Further, when expressed as "on (over)" or "under (below)", it may include not only the upper direction but also the lower direction based on one element.

FIG. 1 is a view showing a circuit board according to an embodiment.

Before describing of the present invention, recently, 5G technology has been developed, and accordingly, interest in circuit boards that can reflect it is increasing. At this time, the circuit board must have a high multi-layer structure in order to apply the 5G technology, and accordingly the circuit pattern must be miniaturized. However, although a comparative example makes it possible to form a fine pattern, there is a problem in that it cannot be stably protected. For example, a circuit pattern applied to a circuit board for 5G has a narrow line width, and accordingly, an interval between the patterns is narrowed. However, although the prior art can form a fine pattern, it cannot be suppressed when migration of a metal material constituting the fine pattern occurs, and thus there is a reliability problem. Accordingly, the embodiment provides a circuit board having a new structure that can solve the reliability problem.

Specifically, referring to FIG. 1, the circuit board includes an insulating layer 140, a first circuit pattern 130, a first barrier layer 120 and 130, a second circuit pattern 160, and a second barrier layer 150 and 170, a first protective layer 180, and a second protective layer 185.

Before describing of FIG. 1, a circuit board according to an embodiment may have a multilayer structure based on an insulating layer. That is, although the circuit board in FIG. 1 is illustrated as including a single insulating layer, the embodiment is not limited thereto. For example, the circuit board in the embodiment may include a plurality of insulating layers. For example, the insulating layer 140 of FIG. 1 may represent a first outermost insulating layer among a plurality of insulating layers, and the first circuit pattern 130 may represent a first outer layer circuit pattern protruding on the first outermost insulating layer. For example, the insulating layer 140 of FIG. 1 may represent a second outermost insulating layer among a plurality of insulating layers, and the second circuit pattern 160 may represent a second outer layer circuit pattern buried in the second outermost insulating layer.

The insulating layer 140 may represent any one specific layer in a plurality of stacked structures. The insulating layer 140 is a substrate on which an electric circuit capable of changing wiring is formed, and may include a printed circuit board, a wiring board, and an insulating substrate made of an insulating material capable of forming circuit patterns on a surface.

For example, the insulating layer 140 may be rigid or flexible. For example, the insulating layer 140 may include glass or plastic. Specifically, the insulating layer 140 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

In addition, the insulating layer 140 may include an optically isotropic film. As an example, the insulating layer 140 may include cyclic olefin copolymer (COC), cyclic olefin polymer (COP), optically isotropic PC, optically isotropic polymethylmethacrylate (PMMA), or the like.

In addition, the insulating layer 140 may be partially bent while having a curved surface. That is, the insulating layer 140 may partially have a plane and may partially be bent while having a curved surface. Specifically, an end portion of the insulating layer 140 may be bent while having a curved surface, or bent or crooked while having a surface with a random curvature. Accordingly, the circuit board in the embodiment is applicable to electronic devices having various shapes.

In addition, the insulating layer 140 may be a flexible substrate having flexibility. Further, the insulating layer 140 may be a curved or bent substrate. At this point, the insulating layer 140 123 may form a wiring layout for electrical wirings which connect circuit components based on a circuit design, and electrical conductors may be disposed on an insulating material. Further, electrical components may be mounted on the insulating layer 140 may form wirings configured to connect the electrical components to make a circuit, and may mechanically fix the components besides functioning to electrically connect the components.

A circuit pattern may be disposed on a surface of the insulating layer 140.

For example, a first circuit pattern 130 may be disposed under a lower surface of the insulating layer 140.

In addition, a second circuit pattern 160 may be disposed on an upper surface of the insulating layer 140.

The first circuit pattern 130 may be formed by being buried in a lower portion of the insulating layer 140. A side surface of the first circuit pattern 130 may be surrounded by the insulating layer 140. However, the side surface of the first circuit pattern 130 may not contact the insulating layer 140. That is, a first-second portion 120 of a first barrier layer may be positioned between the side surface of the first circuit pattern 130 and the insulating layer 140. Accordingly, the side surface of the first circuit pattern 130 may be spaced apart from the insulating layer 140 by a thickness of the first-second portion 120 of the first barrier layer.

In addition, an upper surface of the first circuit pattern 130 may be portioned in the insulating layer 140. Specifically, the upper surface of the first circuit pattern 130 may be positioned higher than a lower surface of the insulating layer 140. Meanwhile, the upper surface of the first circuit pattern 130 may not contact the insulating layer 140. That is, a first-second portion 120 of the first barrier layer may be positioned between the upper surface of the first circuit pattern 130 and the insulating layer 140. Accordingly, the upper surface of the first circuit pattern 130 may be spaced apart from the insulating layer 140 by a thickness of the first-second portion 120 of the first barrier layer.

A lower surface of the first circuit pattern 130 may be positioned on the same plane as a lower surface of the insulating layer 140.

As described above, upper, lower and side surfaces of the first circuit pattern 130 do not contact the insulating layer 140. Accordingly, the embodiment can solve the problem that the metal material constituting the first circuit pattern 130 migrates to the insulating layer 140.

That is, although the first circuit pattern 130 is buried in a lower portion of the insulating layer 140, it may not be in direct contact with the insulating layer 140 by the first-second portion 120 of the first barrier layer. That is, the first-second portion 120 of the first barrier layer may be positioned between the side and upper surfaces of the first circuit pattern 130 and the insulating layer 140. Accordingly, the side surface and the upper surface of the first circuit pattern 130 may be spaced apart from the insulating layer 140 by a thickness of the first-second portion 120 of the first barrier layer.

The second circuit pattern 160 is disposed to protrude on an upper surface of the insulating layer 140. In this case, the second circuit pattern 160 may not contact the insulating layer 140. That is, a lower surface of the second circuit pattern 160 may be spaced apart from the upper surface of the insulating layer 140 by a predetermined interval. That is, a lower surface of the second circuit pattern 160 may be positioned higher than the upper surface of the insulating layer 140. Specifically, a second-first portion 150 of the second barrier layer may be positioned between a lower surface of the first circuit pattern 130 and an upper surface of the insulating layer 140. Accordingly, the lower surface of the second circuit pattern 160 may be spaced apart from the insulating layer 140 by a thickness of the second-first portion 150 of the second barrier layer.

That is, although the second circuit pattern 160 is disposed on the upper surface of the insulating layer 140, it may not directly contact the insulating layer 140 by the second-first portion 150 of the second barrier layer. That is, the second-first portion 150 of the second barrier layer may be positioned between the lower surface of the second circuit pattern 160 and the upper surface of the insulating layer 140. Accordingly, the lower surface of the second circuit pattern 160 may be spaced apart from the insulating layer 140 by a thickness of the first portion of the second barrier layer.

The first circuit pattern 130 and the second circuit pattern 160 as described above are wires for transmitting electrical signals, and may be formed of a metal material having high electrical conductivity. Preferably, the first circuit pattern 130 and the second circuit pattern 160 may be formed of copper (Cu), which has high electrical conductivity and is relatively inexpensive.

In addition, migration in which copper ions penetrate into the insulating layer 140 may occur by forming the first circuit pattern 130 and the second circuit pattern 160 of copper. In this case, a first barrier layer is disposed between the first circuit pattern 130 and the insulating layer 140 in the embodiment. In addition, a second barrier layer is disposed between the second circuit pattern 160 and the insulating layer 140 in the embodiment. Accordingly, the embodiment can prevent migration of the copper ions from penetrating into the insulating layer 140, thereby improving the reliability of the fine pattern.

Meanwhile, a first protective layer 180 is disposed under a lower surface of the insulating layer 140. In addition, a second protective layer 185 is disposed on an upper surface of the insulating layer 140.

The first protective layer 180 and the second protective layer 182 may be formed of at least one layer using any one or more of Solder Resist (SR), oxide, and Au. Preferably, the first protective layer 180 and the second protective layer 185 may be solder resist.

The first protective layer 180 may be disposed under a lower surface of the insulating layer 140 to protect the first circuit pattern 130.

For example, the first protective layer 180 may protect a lower surface of the first circuit pattern 130. In this case, the first protective layer 180 may not directly contact the first circuit pattern 130.

The second protective layer 185 may be disposed to cover the second circuit pattern 160. That is, a side surface of the second circuit pattern 160 may be surrounded by the second protective layer 185. However, the side surface of the second circuit pattern 160 may not contact the second protective layer 185. That is, a second-second portion 170 of the second barrier layer may be positioned between the side surface of the second circuit pattern 160 and the second protective layer 185. Accordingly, the side surface of the second circuit pattern 160 may be spaced apart from the second protective layer 185 by a thickness of the second-second portion 170 of the second barrier layer.

In addition, at least a portion of an upper side of the second circuit pattern 160 may be covered by the second protective layer 185. That is, an upper surface of the second circuit pattern 160 may be positioned lower than an upper surface of the second protective layer 185. In this case, the upper surface of the second circuit pattern 160 may not contact the second protective layer 185. That is, a second-second portion 170 of the second barrier layer may be positioned between the upper surface of the second circuit pattern 160 and the second protective layer 185. Accordingly, the upper surface of the second circuit pattern 160 may be spaced apart from the second protective layer 185 by a thickness of the second-second second portion 170 of the second barrier layer.

A lower surface of the second circuit pattern 160 may be positioned higher than the upper surface of the insulating layer 140 and higher than a lower surface of the second protective layer 185.

As described above, upper, lower and side surfaces of the second circuit pattern 160 do not contact the insulating layer 140 and the second protective layer 185. Accordingly, the embodiment may solve the problem that copper ions constituting the second circuit pattern 160 migrate to the second protective layer 185.

That is, the second circuit pattern 160 protrudes on the upper surface of the insulating layer 140 and is covered by the second protective layer 185. However, the second circuit pattern 160 may not directly contact the second protective layer 185 by the second-second portion 170 of the second barrier layer. That is, the second-second portion 170 of the second barrier layer may be positioned between the side and upper surfaces of the second circuit pattern 160 and the second passivation layer 185. Accordingly, the side surface and the upper surface of the second circuit pattern 160 may be spaced apart from the second protective layer 185 by a thickness of the second-second portion 170 of the second barrier layer.

Hereinafter, the first barrier layer and the second barrier layer will be described.

The first barrier layer may be disposed between the first circuit pattern 130 and the insulating layer 140. Also, the first barrier layer may be disposed between the first circuit pattern 130 and the first protective layer 180.

Specifically, the first barrier layer includes a first-first portion 110 disposed between the first circuit pattern 130 and the first protective layer 180. In addition, the first barrier layer includes a first-second portion 120 disposed between the first circuit pattern 130 and the insulating layer 140.

Each of the first-first portion 110 and the first-second portion 120 of the first barrier layer may include a plurality of layers.

That is, the first-first portion 110 of the first barrier layer includes a first-first metal layer 111. The first-first metal layer 111 may be formed of a metal material including palladium (Pd). The first-first metal layer 111 may function to prevent copper ions constituting the first circuit pattern 130 from migrating to the first protective layer 180.

In addition, the first-first portion 110 of the first barrier layer includes a first-second metal layer 112 disposed between a lower surface of the first circuit pattern 130 and the first-first metal layer 111. The first-second metal layer 112 may be a seed layer of the first-first metal layer 111. In addition, the first-second metal layer 112 may function to primarily block the migration of copper ions constituting the first circuit pattern 130. Accordingly, the first-second metal layer 112 in the embodiment is formed between the first circuit pattern 130 and the first-first metal layer 111 using gold (Au) having a relatively large grain size. In this case, the first-first metal layer 111 may be referred to as a first-first palladium layer. Also, the first-second metal layer 112 may be referred to as a first-first gold layer.

The first-second metal layer 112 may be disposed under a lower surface of the first circuit pattern 130 to have a first width. In this case, the first width of the first-second metal layer 112 may be greater than a second width of a lower surface of the first circuit pattern 130. Accordingly, the first circuit pattern 130 may not contact the first protective layer 180.

The first-first metal layer 111 may be disposed under the lower surface of the first-second metal layer 112 to have the same first width as the first-second metal layer 112.

That is, the first-second portion 120 of the first barrier layer includes the second-first metal layer 121. The second-first metal layer 121 may be formed of a metal material including palladium (Pd). The second-first metal layer 111 may function to prevent copper ions constituting the first circuit pattern 130 from migrating to the insulating layer 140.

In addition, the first-second portion 120 of the first barrier layer includes a second-second metal layer 122 disposed between side and upper surfaces of the first circuit pattern 130 and the second-first metal layer 121. The second-second metal layer 122 may be a seed layer of the second-first metal layer 121.

Accordingly, the second-second metal layer 122 in the embodiment made of a metal including gold (Au) having a relatively large grain size is formed on the side surface and the upper surface of the first circuit pattern 130. The second-first metal layer 121 may be formed by plating the second-second metal layer 122 as a seed layer. In this case, the second-first metal layer 121 may be referred to as a first-second palladium layer. In addition, the second-second metal layer 122 may be referred to as a first-second gold layer.

The second-second metal layer 122 may be disposed to surround side surfaces and upper surfaces of the first circuit pattern 130. Also, the second-first metal layer 121 may be disposed to surround the second-second metal layer 122.

Meanwhile, an upper surface of the first-second metal layer 112 may include a first region in contact with a lower surface of the first circuit pattern 130. In addition, an upper surface of the first-second metal layer 112 may include a second region in contact with the second-first metal layer 121. In addition, an upper surface of the first-second metal layer 112 may include a third region in contact with the second-second metal layer 122. Accordingly, the first-first metal layer 111 of the embodiment may not contact the first circuit pattern 130, the second-first metal layer 121, and the second-second metal layer 122.

A second barrier layer may be disposed between the second circuit pattern 160 and the insulating layer 140. Also, the second barrier layer may be disposed between the second circuit pattern 160 and the second protective layer 185.

Specifically, the second barrier layer includes a second-first portion 150 disposed between the second circuit pattern 160 and the insulating layer 140. In addition, the second barrier layer includes a second-second portion 170 disposed between the second circuit pattern 160 and the second protective layer 185.

Each of the second-first portion 150 and the second-second portion 170 of the second barrier layer may include a plurality of layers.

That is, the second-first portion 150 of the second barrier layer includes a third-first metal layer 151. The third-first metal layer 151 may be formed of a metal material including palladium (Pd). The third-first metal layer 151 may function to prevent copper ions constituting the second circuit pattern 160 from migrating to the insulating layer 140.

In addition, the second-first portion 150 of the second barrier layer includes a third-second metal layer 152 disposed between a lower surface of the second circuit pattern 160 and the third-first metal layer 151. The third-second metal layer 152 may be a seed layer of the third-first metal layer 151. Accordingly, the third-second metal layer 152 of the embodiment includes gold (Au) having a relatively large grain size and is formed on the lower surface of the second circuit pattern 160. In addition, the third-first metal layer 151 may be formed by plating the third-second metal layer 152 as a seed layer. In this case, the third-first metal layer 151 may be referred to as a second-first palladium layer. In addition, the third-second metal layer 152 may be referred to as a second-first gold layer.

The third-second metal layer 152 may be disposed under a lower surface of the second circuit pattern 160 to have a first width. In this case, the first width of the third-second metal layer 152 may be greater than a second width of a lower surface of the second circuit pattern 160. Accordingly, the second circuit pattern 160 may not contact the insulating layer 140.

The third-first metal layer 151 may be disposed under the lower surface of the third-second metal layer 152 to have the same first width as the third-second metal layer 152.

That is, the second-second portion 170 of the second barrier layer includes a fourth-first metal layer 171. The fourth-first metal layer 171 may be formed of a metal material including palladium (Pd). The second-first metal layer 111 may function to prevent copper ions constituting the second circuit pattern 160 from migrating to the second protective layer 185.

In addition, the second-second portion 170 of the second barrier layer includes a fourth-second metal layer 172 disposed between side and upper surfaces of the second circuit pattern 160 and the fourth-first metal layer 171. The fourth-second metal layer 172 may be a seed layer of the fourth-first metal layer 171. In the embodiment, a fourth-second metal layer 172 of the embodiment includes gold (Au) having a relatively large grain size and is formed on side and upper surfaces of the second circuit pattern 160. In addition, fourth-first metal layer 171 may be formed by plating the fourth-second metal layer 172 as a seed layer. In this case, the fourth-first metal layer 171 may be referred to as a second-second palladium layer. In addition, the fourth-second metal layer 172 may be referred to as a second-second gold layer.

The fourth-second metal layer 172 may be disposed to surround side and upper surfaces of the second circuit pattern 160. Also, the fourth-first metal layer 171 may be disposed to surround the fourth-second metal layer 172.

Meanwhile, an upper surface of the third-second metal layer 152 may include a first region in contact with a lower surface of the second circuit pattern 160. In addition, an upper surface of the third-second metal layer 152 may include a second region in contact with the fourth-first metal layer 171. In addition, the upper surface of the third-second metal layer 152 may include a third region in contact with the fourth-second metal layer 172. Accordingly, the third-first metal layer 151 of the embodiment may not contact the second circuit pattern 160, the fourth-first metal layer 171, and the fourth-second metal layer 172.

The embodiment such as the above provides a circuit board including an insulating layer and a circuit pattern. In this case, the circuit pattern is formed of a metal material including copper. In this case, the circuit pattern formed of the metal material including copper does not directly contact the insulating layer. To this end, a barrier layer is disposed around the circuit pattern. For example, the embodiment includes a gold metal layer disposed around the circuit pattern and containing gold (Au), and a palladium metal layer disposed around the gold metal layer and including palladium (Pd). The palladium metal layer may prevent copper constituting the circuit pattern from penetrating toward the insulating layer, and accordingly, it is possible to improve reliability by suppressing the occurrence of copper migration. In addition, the gold metal layer is disposed between the palladium metal layer and the circuit pattern to form the palladium metal layer. In this case, the gold metal layer includes gold (Au) having a larger grain size than other layers, and thus the palladium metal layer can be stably formed.

In addition, the barrier layer in the embodiment is also formed on a circuit pattern disposed on an outermost layer among the circuit patterns. This may prevent migration of copper constituting the circuit pattern of the outermost layer to a solder resist.

In addition, a portion of the barrier layer is disposed on a surface of a buried pattern in the ETS (Embedded Trace Substrate) structure of the embodiment. In this case, the barrier layer is disposed to protrude on the surface of the buried pattern, and this may function as a mounting pad on which a solder layer for mounting a device is disposed. That is, a buried pattern of a conventional ETS structure is formed in a fine pattern, as a result, it was not possible to function as a mounting pad only with a simple pattern, and accordingly, a separate mounting pad having a structure that is buried in the insulating layer or protrudes above the surface of the insulating layer has to be formed. At this time, when the mounting pad is buried in the insulating layer, an interval between the fine patterns is widened by a width of the mounting pad, and thus there is a problem in circuit integration. In addition, when a structure in which the mounting pad protrudes on the insulating layer is applied, it was necessary to proceed with a separate process to form it. On the other hand, when forming the barrier layer on the buried pattern, the embodiment allows a portion of the barrier layer to have a structure protruding on a surface of the insulating layer, and accordingly, the barrier layer can be used as a mounting pad, thereby simplifying the manufacturing process.

FIG. 2 is a view showing a circuit board including a via according to an exemplary embodiment.

Meanwhile, although only the circuit pattern has been described in FIG. 1, a circuit board 100A according to the embodiment may include a via 190 disposed in the insulating layer 140.

Referring to FIG. 2, a via 190 may be formed to pass through the insulating layer 140. Specifically, the via 190 may electrically connect between the first circuit pattern 130 and the second circuit pattern 160. In this case, the via 190 may be formed of a metal material including copper. Accordingly, copper ions constituting the via 190 may migrate to the insulating layer 140. Accordingly, the via 190 in the embodiment may have a three-layer structure in a horizontal direction. That is, the via 190 may be formed by plating a metal material in a via hole (not shown) passing through the insulating layer 140.

At this time, when the via hole is formed, a fifth-first metal layer 191 of the embodiment is preferentially formed on an inner wall of the via hole. The fifth-first metal layer 191 may be formed of a metal including palladium.

In addition, the via 190 may include a fifth-second metal layer 192 formed on an inner surface of the fifth-first metal layer 191. The fifth-second metal layer 192 may include gold.

Also, the via 190 may include a fifth-third metal layer 193. The fifth-third metal layer 193 may include copper. The fifth-third metal layer 193 may be formed to fill an inside of the via hole. That is, the via hole of the embodiment are not all filled by the fifth-third metal layer 193, the fifth-third metal layer 193 is formed after the fifth-first metal layer 191 and the fifth-second metal layer 192 are formed. Accordingly, it is possible to prevent migration of copper ions constituting the fifth-third metal layer 193 to the insulating layer 140.

Hereinafter, a method of manufacturing a circuit board according to an embodiment will be described. FIGS. 3 to 15 are views showing the manufacturing method of the circuit board shown in FIG. 1 in order of process.

Referring to FIG. 3, a carrier board 210 serving as a basic material is prepared for manufacturing a circuit board. The carrier board 210 may include an insulating member 211 and a metal layer 212 disposed on the insulating member 211.

In this case, although it is illustrated that the metal layer 212 is disposed only on one surface of the insulating member 211 in the drawing, the embodiment is not limited thereto. That is, the metal layer 212 may be disposed on both sides of the insulating member 211, and accordingly, a plurality of circuit boards may be simultaneously manufactured on both sides of the insulating member 211.

Next, referring to FIG. 4, a first-first portion 110 constituting a first barrier layer is formed on the carrier board 210.

That is, the first-first portion 110 of the first barrier layer may include a first-first metal layer 111 disposed on the carrier board 210 and a first-second metal layer 112 disposed on the first-first metal layer 111.

The first-first metal layer 111 may include palladium. In addition, the first-second metal layer 112 may include gold. The first-first metal layer 111 and the first-second metal layer 112 may be formed through a chemical copper plating process.

Next, referring to FIG. 5, a first mask M1 of the embodiment is formed on the first-first portion 110 of the first barrier layer. The first mask M1 may include an opening (not shown) exposing a region where the first circuit pattern 130 is to be formed.

In addition, a first circuit pattern 130 filling an opening of the first mask M1 of the embodiment is formed by plating a first portion of the first barrier layer as a seed layer.

Next, referring to FIG. 6, the first mask M1 is removed, and a second mask M2 is formed on the first-first portion 110 of the first barrier layer. The second mask M2 may include an opening (not shown) exposing a region in which the second-second metal layer 122 is to be formed among the first-second portion 120 of the first barrier layer.

Then, a second-second metal layer 122 filling the opening of the second mask M2 of the embodiment is formed by plating the first-first portion 110 of the first barrier layer as a seed layer.

Next, referring to FIG. 7, the second mask M2 is removed, and a third mask M3 is formed on the first-first portion 110 of the first barrier layer. The third mask M3 may include an opening (not shown) exposing a region in which the second-first metal layer 121 is to be formed among the first-second portion 120 of the first barrier layer.

Then, a second-first metal layer 121 filling the opening of the third mask M3 of the embodiment is formed by plating the first-first portion 110 of the first barrier layer as a seed layer.

Next, referring to FIG. 8, an insulating layer 140 covering the first circuit pattern 130 is formed on the first barrier layer.

Next, referring to FIG. 9, a second-first portion 150 constituting a second barrier layer is formed on the insulating layer 140.

That is, the second-first portion 150 of the second barrier layer includes a third-first metal layer 151 disposed on the insulating layer 140 and a third-second metal layer 152 disposed on the third-first metal layer 151.

The third-first metal layer 151 may include palladium. Also, the third-second metal layer 152 may include gold. The third-first metal layer 151 and the third-second metal layer 152 may be formed through a chemical copper plating process.

Next, referring to FIG. 10, a second circuit pattern 160 is formed on the second-first portion 150 of the second barrier layer, and a second-second portion 170 of the second barrier layer is formed on the second circuit pattern 160 by sequentially re-performing the processes of FIGS. 5 to 7. A second-second portion 170 of the second barrier layer includes a fourth-first metal layer 171 and a four-second metal layer 172.

Next, referring to FIG. 11, a process of removing a part of the second-first portion 150 of the second barrier layer may be performed.

Next, referring to FIG. 12, a process of removing the carrier board 210 may be performed.

Next, referring to FIG. 13, a process of removing a part of the first-first portion 110 of the first barrier layer may be performed.

Next, referring to FIG. 14, a process of forming the first protective layer 180 on the lower surface of the insulating layer 140 and forming the second protective layer 185 on the upper surface of the insulating layer 140 may be performed.

That is, the first protective layer 180 is disposed under the lower surface of the insulating layer 140. In addition, the second protective layer 185 is disposed on the upper surface of the insulating layer 140.

The first protective layer 180 and the second protective layer 182 may be formed of at least one layer using any one or more of Solder Resist (SR), oxide, and Au. Preferably, the first protective layer 180 and the second protective layer 185 may be solder resist.

Meanwhile, referring to FIG. 15, the first protective layer 180A according to another embodiment may include an opening (not shown) exposing a part of the first-first portion 110 of the first barrier layer.

Also, the second protective layer 185A according to another exemplary embodiment may include an opening exposing a part of the second-second portion 170 of the second barrier layer.

Accordingly, a first barrier layer surrounding the first circuit pattern 130 and a second barrier layer surrounding the second circuit pattern 160 in the embodiment may be formed.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising:
a first protective layer;
a first circuit pattern disposed on the first protective layer;
an insulating layer disposed on the first protective layer and the first circuit pattern; and
a first barrier layer surrounding an upper surface, a side surface and a lower surface of the first circuit pattern and disposed in the first protective layer and the insulating layer,
wherein the first barrier layer includes a first portion disposed in the first protective layer, and a second portion disposed in the insulating layer,
wherein the first portion of the first barrier layer includes:
a first metal layer disposed under the lower surface of the first circuit pattern; and
a second metal layer disposed under a lower surface of the first metal layer and including a metal material different from that of the first metal layer,
wherein the second portion of the first barrier layer includes:
a third metal layer disposed surrounding the side surface and the upper surfaces of the first circuit pattern and including the same metal material as that of the first metal layer; and
a fourth metal layer disposed surrounding the third metal layer and including the same metal material as the second metal layer.

2. The circuit board of claim 1, wherein the first metal layer and the third metal layer include gold (Au), and
wherein the second metal layer and the fourth metal layer include palladium (Pd).

3. The circuit board of claim 1, wherein each of the upper surface, the side surface and the lower surface of the first circuit pattern does not contact the insulating layer and the first protective layer.

4. The circuit board of claim 1, wherein a width of the first metal layer is greater than a width of the first circuit pattern.

5. The circuit board of claim 4, wherein an upper surface of the first metal layer includes:
a first region in contact with the first circuit pattern;
a second region in contact with the third metal layer; and
a third region in contact with the fourth metal layer.

6. The circuit board of claim 1, wherein the first circuit pattern is buried in a lower region of the insulating layer.

7. The circuit board of claim 6, wherein the lower surface of the first circuit pattern is positioned on the same plane as a lower surface of the insulating layer, and
wherein the first portion of the first barrier layer protrudes downward from the lower surface of the insulating layer.

8. The circuit board of claim 1, further comprising:
a second circuit pattern disposed on the insulating layer;
a second barrier layer surrounding an upper surface, a lower surface and a side surface of the second circuit pattern and disposed on the insulating layer; and
a second protective layer disposed on the second barrier layer.

9. The circuit board of claim 8, wherein the second barrier layer includes:
a third portion disposed between an upper surface of the insulating layer and the lower surface of the second circuit pattern; and
a fourth portion disposed on the third portion to surround the upper surface and the side surface of the second circuit pattern.

10. The circuit board of claim 9, wherein the third portion of the second barrier layer includes:
a fifth metal layer disposed on the insulating layer;
a sixth metal layer disposed on the fifth metal layer and including a metal material different from that of the fifth metal layer; and
wherein the second circuit pattern is disposed on the sixth metal layer.

11. The circuit board of claim 10, wherein the fifth metal layer includes palladium, and
wherein the sixth metal layer includes gold.

12. The circuit board of claim 10, wherein the fourth portion of the second barrier layer includes:
a seventh metal layer disposed surrounding the upper surface and the side surface of the second circuit pattern and including the same metal material as that of the sixth metal layer; and
an eighth metal layer disposed surrounding the seventh metal layer and including the same metal material as the fifth metal layer.

13. The circuit board of claim 12, wherein each of the upper surface, the side surface and the lower surface of the second circuit pattern do not contact the insulating layer and the second protective layer.

14. The circuit board of claim 12, wherein the sixth metal layer has a width greater than a width of the second circuit pattern.

15. The circuit board of claim 14, wherein an upper surface of the sixth metal layer includes:
a first region in contact with the lower surface of the second circuit pattern;
a second region in contact with the seventh metal layer; and
a third region in contact with the eighth metal layer.

16. The circuit board of claim 15, wherein the lower surface of the second circuit pattern is positioned higher than an upper surface of the insulating layer and a lower surface of the second protective layer.

17. The circuit board of claim 9, wherein the second protective layer includes a second opening overlapping with at least a part of the fourth portion of the second barrier layer in a vertical direction.

18. The circuit board of claim 1, wherein the first protective layer includes a first opening overlapping with at least a part of the first portion of the first barrier layer in a vertical direction.

* * * * *